United States Patent
Schemmel et al.

(10) Patent No.: US 6,718,227 B1
(45) Date of Patent: Apr. 6, 2004

(54) SYSTEM AND METHOD FOR DETERMINING A POSITION ERROR IN A WAFER HANDLING DEVICE

(75) Inventors: Floyd F. Schemmel, Sherman, TX (US); George W. Reeves, Sherman, TX (US); Troy W. Hoehner, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 09/689,089

(22) Filed: Oct. 12, 2000

Related U.S. Application Data
(60) Provisional application No. 60/172,707, filed on Dec. 16, 1999.

(51) Int. Cl.⁷ .................................................. G06F 7/00
(52) U.S. Cl. ..................... 700/213; 700/189; 700/190; 700/218; 700/229
(58) Field of Search .............................. 700/213, 189, 700/190, 229, 218

(56) References Cited
U.S. PATENT DOCUMENTS

| | | | | |
|---|---|---|---|---|
| 4,510,565 A | * | 4/1985 | Dummermuth | 364/136 |
| 4,685,206 A | * | 8/1987 | Kobayashi et al. | 29/740 |
| 4,786,617 A | * | 11/1988 | Umatate et al. | 250/548 |
| 4,819,167 A | * | 4/1989 | Cheng et al. | 364/167.01 |
| 4,833,621 A | * | 5/1989 | Umatete | 364/491 |
| 4,903,437 A | * | 2/1990 | Kubotera et al. | 51/165.71 |
| 5,204,535 A | * | 4/1993 | Mizutani | 250/548 |
| 5,365,342 A | * | 11/1994 | Ayata et al. | 356/401 |
| 5,381,210 A | * | 1/1995 | Hagiwara | 355/53 |
| 5,392,371 A | * | 2/1995 | Imaizumi et al. | 382/2 |
| 5,500,869 A | * | 3/1996 | Yoshida et al. | 372/50 |
| 5,511,005 A | * | 4/1996 | Abbe et al. | 364/552 |
| 5,524,175 A | * | 6/1996 | Sato et al. | 395/11 |
| 5,563,798 A | * | 10/1996 | Berken et al. | 364/478.06 |
| 5,640,101 A | * | 6/1997 | Kuji et al. | 324/754 |
| 5,645,391 A | * | 7/1997 | Ohsawa et al. | 414/416 |
| 5,737,441 A | * | 4/1998 | Nishi | 382/151 |
| 5,740,034 A | * | 4/1998 | Sacki | 364/167.01 |
| 5,747,816 A | * | 5/1998 | Kurosaki | 250/491.1 |
| 5,801,390 A | * | 9/1998 | Shiraishi | 250/559.3 |
| 5,811,211 A | * | 9/1998 | Tanaka et al. | 430/30 |
| 5,825,483 A | * | 10/1998 | Michael et al. | 356/243 |
| 5,978,081 A | * | 11/1999 | Michael et al. | 356/243.1 |
| 5,982,474 A | * | 11/1999 | Akiyama et al. | 355/53 |
| 6,108,089 A | * | 8/2000 | Shiraishi | 356/375 |
| 6,275,742 B1 | * | 8/2001 | Sagues et al. | 700/213 |
| 6,331,885 B1 | * | 12/2001 | Nishi | 355/53 |
| 6,354,909 B1 | * | 3/2002 | Boucher et al. | 451/12 |
| 2001/0024278 A1 | * | 9/2001 | Yoshida | 356/401 |

* cited by examiner

*Primary Examiner*—Donald P. Walsh
*Assistant Examiner*—Michael E. Butler
(74) *Attorney, Agent, or Firm*—Michael K. Skrehot; Wade James Brady, III; Frederick J. Telecky, Jr.

(57) ABSTRACT

A system for determining a position error in a wafer handling device includes a control module, an image acquisition module, and an image analysis module. The control module moves a workpiece having one or more reference marks, and the image acquisition module captures an image of at least one reference mark. The image analysis module, which is coupled to the image acquisition module, compares the captured image to stored target information to determine a position error.

17 Claims, 3 Drawing Sheets

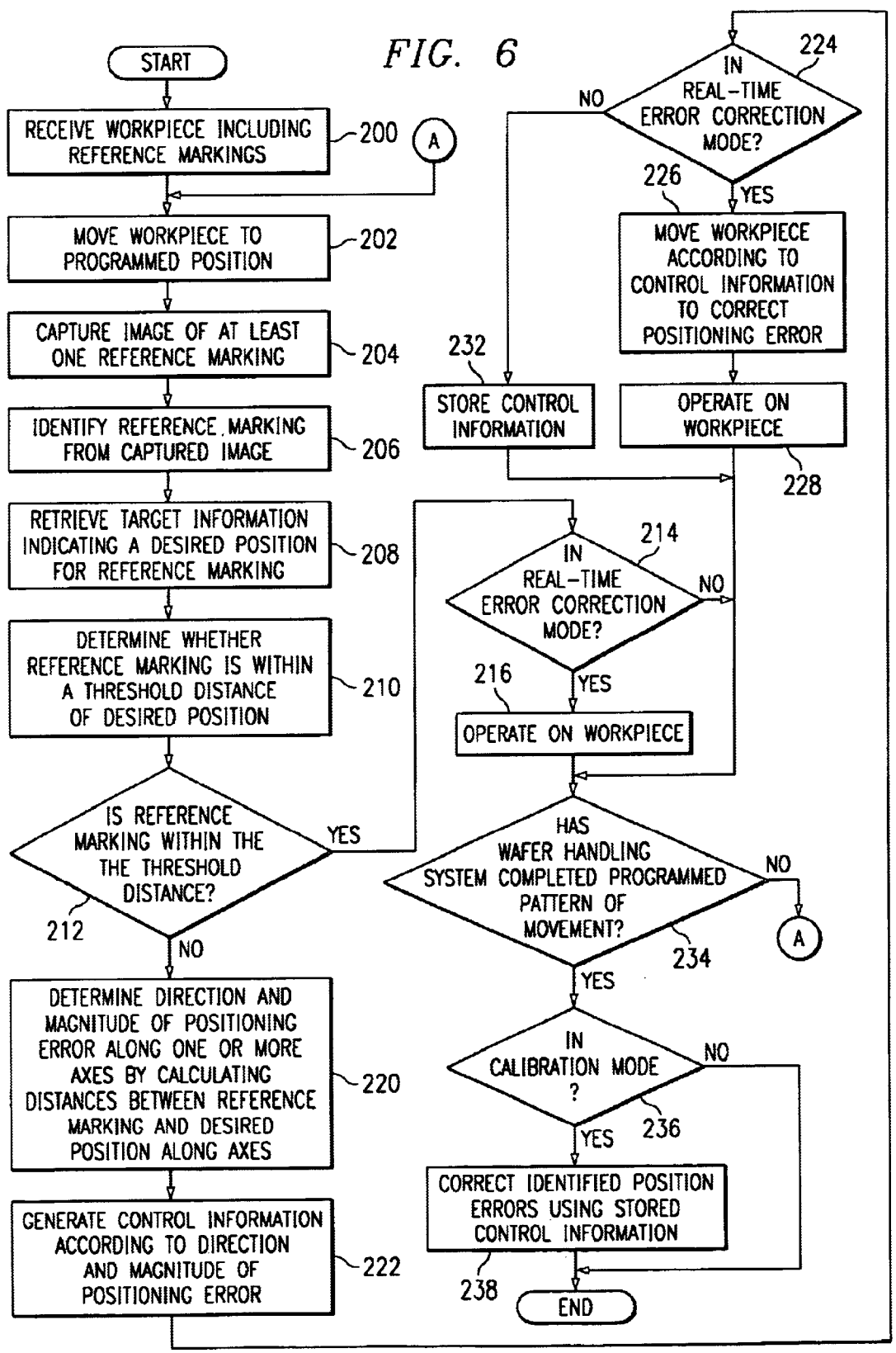

SYSTEM AND METHOD FOR DETERMINING A POSITION ERROR IN A WAFER HANDLING DEVICE

This application claims priority under 35 USC §119(e)(1) of provisional application No. 60/172,707 filed Dec. 16, 1999.

TECHNICAL FIELD OF THE INVENTION

This invention relates generally to the field of wafer processing and, more particularly, to a system and method for determining a position error in a wafer handling device.

BACKGROUND OF THE INVENTION

Probers, steppers, wafer inspection systems, integrated circuit mounters, bonders, and other wafer handling devices typically must accurately position wafers of integrated circuits before operating on the wafers. For example, a prober must accurately position a wafer before electrically testing the integrated circuits mounted to the wafer. If the prober correctly positions the wafer, testing probes touch and electrically couple to contact points, allowing the prober to test the integrated circuits. If, however, the prober incorrectly positions the wafer, the testing probes may miss the contact points, and as a result, the prober may be unable to test the integrated circuits. Even worse, the testing probes may accidentally touch and damage integrated circuits on the wafer. To avoid these and other positioning problems, wafer handling devices typically uses high-precision lead screws, air bearing tables, or other mechanical devices to properly position wafers.

Unfortunately, wafer handling devices still suffer from position errors due to manufacturing faults, mechanical wear and stress, temperature variations, and other sources of positioning inaccuracies. Faults in the construction of lead screws, bearings, bushings, or other physical components introduce positioning inaccuracies in wafer handling devices, and mechanical stress and wear further deteriorate the positioning accuracy of these devices. Chucks, tools, and the electronic motor drive provide still another source of position errors. By causing materials to expand or contract, temperature variations also affect the position of a wafer in a wafer handling device. Due to these and other factors, wafer handling devices often improperly position wafers during operation.

SUMMARY OF THE INVENTION

In accordance with the present invention, a system and method for determining a position error in a wafer handling device is provided that substantially eliminates or reduces disadvantages or problems associated with previously developed systems and methods.

In one embodiment, a system for determining a position error in a wafer handling device includes a control module, an image acquisition module, and an image analysis module. The control module moves a workpiece having one or more reference marks, and the image acquisition module captures an image of at least one reference mark. The image analysis module, which is coupled to the image acquisition module, compares the captured image to stored target information to determine a position error.

The technical advantages of the present invention include a system and method for determining a position error in a wafer handling device. By using automatic visual inspection technology, the system and method accurately and efficiently identify a position error, determine a direction and magnitude of the position error along one or more axes, and generate control information to correct the position error. When in a calibration mode, the system and method profile the positioning accuracy of a wafer handling device over a specified plane of operation, generate control information to improve the positioning accuracy of the wafer handling device, and store the control information for future use by the wafer handling device. When in a real-time error correction mode, the system and method identify and correct position errors as a wafer handling device operates on a wafer. Other technical advantages are readily apparent from the attached description, figures, and claims.

BRIEF DESCRIPTION OF THE DRAWINGS

FIG. 6 illustrates a flow chart of a method for determining a position error in a wafer handling device.

DETAILED DESCRIPTION OF THE DRAWINGS

Figure 1:
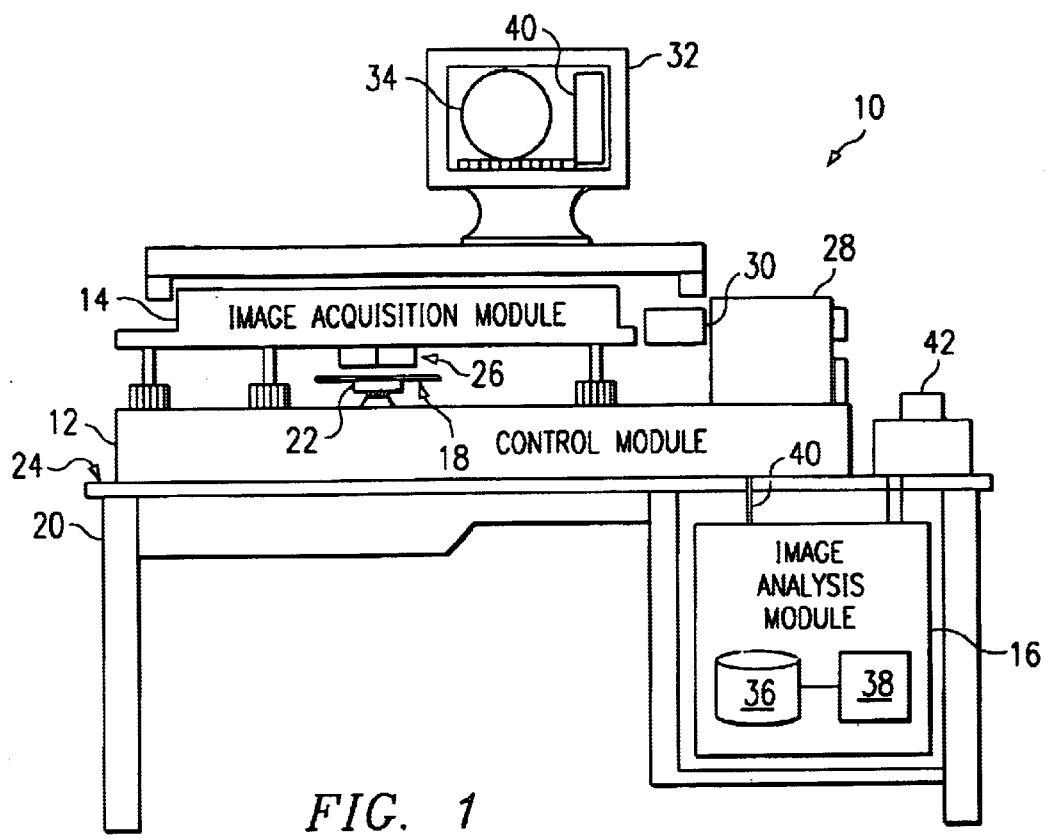
FIG. 1 illustrates a system for determining a position error in a wafer handling device.

FIG. 1 illustrates a system 10 that determines a position error in a wafer handling device. A wafer handling device may be a prober, stepper, wafer inspection system, integrated circuit mounter, bonder, or any other device that operates on a wafer. By using automatic visual inspection (AVI) technology, system 10 accurately and efficiently identifies and corrects position errors to improve the performance of a wafer handling device. The position errors may be the individual result of a single inaccurate incremental movement along an axis or the cumulative result of several inaccurate movements along an axis. When in a calibration mode, system 10 profiles the positioning accuracy of the wafer handling device over a specified plane of operation, generates control information to improve the positioning accuracy of the wafer handling device, and stores the control information for future use by the wafer handling device. When in real-time error correction mode, system 10 identifies and corrects position errors as the wafer handling device operates on a wafer.

System 10 includes a control module 12, an image acquisition module 14, and an image analysis module 16. Control module 12 moves a workpiece 18 to a programmed position, image acquisition module 14 captures an image of at least one reference mark on workpiece 18, and image analysis module 16 compares the captured image to stored target information to determine a position error. In addition, image analysis module 16 generates control information according to the position error and communicates the control information to correct the position error. A table, manufacturing platform, or other suitable structure 20 substantially prevents vibrations or other motions that may interfere with the performance of system 10.

Workpiece 18 includes reference marks that system 10 visually identifies and analyzes to determine a position error. Workpiece 18 may be an actual wafer of integrated circuits, a gauge, or any other structure that may represent a wafer in a wafer handling device. The reference marks may include etchings, impressions, prints, or any other visual marks suitable for identifying a position on workpiece 18. In a particular embodiment, workpiece 18 is an actual wafer of integrated circuits. In such an embodiment, the reference marks may be integrated circuits, component parts of integrated circuits, identifiable features in the integrated circuits, bond pads, or visual marks unrelated to the integrated circuits. Alternatively, workpiece 18 may be a gauge that includes reference marks at predetermined positions. System 10 uses the reference marks on the gauge to measure distances along one or more axes. In a particular embodiment, the gauge is a glass mask or a piece of metal with etched, scribed, or deposited markings.

Control module 12 controls the movement of workpiece 18 using a chuck 22. Chuck 22 receives workpiece 18 and securely holds workpiece 18 to substantially prevent vibrations or other motion that may interferes with the performance of system 10. In a particular embodiment, a cassette 28 houses a number of workpieces 18, and chuck 22 receives a specified one of workpieces 18 from cassette 28. In such an embodiment, an identification reader 30, such as an optical character recognition device or bar code reader, may scan workpiece 18 in transit from cassette 28 and identify workpiece 18. After chuck 22 receives workpiece 18, control module 12 moves workpiece 18 by moving chuck 22 along an X and Y axes substantially parallel to surface 24 of table 20. Control module 12 may also move chuck 22 and workpiece 18 along a Z axis substantially perpendicular to surface 24 of table 20 or rotate chuck 22 to improve the alignment of workpiece 18. In a particular embodiment, control module 22 moves chuck 22 and workpiece 18 in small increments, called stepping increments.

Control module 12 may move chuck 22 and workpiece 18 in response to user input, a programmed pattern of movement, or control information received from image analysis module 16. A user may manually move chuck 22 and workpiece 18 by communicating instructions to control module 12 using a joystick, keyboard, touch screen, or any other suitable user input. In addition, control module 12 may automatically move chuck 22 and workpiece 18 according to a programmed pattern of movement. For example, if system 10 is in the calibration module, control module 12 automatically moves chuck 22 and workpiece 18 along X and Y axes to profile the positioning accuracy of the wafer handling device over a specified plane of operation. On the other hand, if system 10 is in the real-time error correction mode, control module 12 moves chuck 22 and workpiece 18 to programmed positions according to the operations that the wafer handling device performs on workpiece 18. For example, if the wafer handling device is a prober, control module 12 moves chuck 22 and workpiece 18 to a programmed position so that testing probes may touch and electrically couple to contact points, allowing the prober to test the operation of an integrated circuit. To correct position errors, control module 12 also moves chuck 22 and workpiece 18 according to control information generated by image analysis module 16. Control module may be implemented in hardware, software, or a combination of hardware and software.

Once control module 12 moves workpiece 18 under lens 26, image acquisition module 14 captures an image of at least one reference mark on workpiece 18. Image acquisition module 14 may be a still-motion camera, a video camera, an electron microscope, or any other device that may detect visible, infrared, ultraviolet, or any other suitable wavelengths of light. Image acquisition module 14 focuses optical lens 26 to bring the surface of workpiece 18 into a proper focal plane and then captures an image of the surface of workpiece 18. In a particular embodiment, the captured image is a digital representation of the surface of workpiece 18. The minimum acceptable magnification and resolution of the captured image depends on the required positioning accuracy. For example, a 1–2 micron positioning accuracy requires a higher resolution than a 1–2 millimeter positioning accuracy. Image acquisition module 14 communicates the captured image to image analysis module 16 and display unit 32. Display unit 32 receives the captured image and generates a visual representation 34 of the image for a user. Display unit 32 may include a touch screen that allows the user to control image acquisition module 14 and control module 12. Image acquisition module 14 is mounted in a fixed position so that captured images accurately reflect relative positions of workpiece 18. A particular embodiment of image acquisition module 14 is described in further detail below with reference to FIG. 2.

Image analysis module 16 receives a captured image of workpiece 18 from image acquisition module 14 and compares the captured image to stored target information to determine a position error. Image analysis module 16 includes a memory 36 and a processor 38 coupled to memory 36. In a particular embodiment, processor 38 includes one or more digital signal processors. Memory 36 stores target information indicating desired positions for the reference marks on workpiece 18. Processor 38 receives a captured image, identifies at least one reference mark from the captured image, retrieves target information indicating a desired position for the reference mark, and determines whether the reference mark is within a threshold distance of the desired position. If the reference mark is not within the threshold distance, processor 38 identifies a position error. To determine a direction and magnitude of the position error, processor 38 may calculate a distance between the reference mark and the desired position along one or more axes. In a particular embodiment, image analysis module 16 uses image alignment algorithms, optics and camera aberration error normalization, or other image-related analysis techniques to accommodate the captured image and the target information.

Image analysis module 16 also generates control information according to a position error and communicates the control information to control module 12 to correct the position error. Processor 38 may generate the control information based on the determined direction and magnitude of the position error. In particular embodiment, the control information is an error correction table indicating positioning adjustment for stepping increments over an entire X-Y coordinate grid. Image analysis module 16 may directly communicate the control information to control module 12 using a link 40. Alternatively, image analysis module 16 may store the control information in a suitable memory device 42 that can be installed in the wafer handling device. In a particular embodiment, memory device 42 is a Programmable Read Only Memory (PROM).

Image analysis. module 16 also stores and displays error information relating to identified position errors. In a particular embodiment, image analysis module 16 stores the determined direction and magnitude of identified position errors. By later analyzing the stored error information, image analysis module 16 may detect performance degradations over a period of time. In addition to storing error information, image analysis module 16 also presents error information to a user in a human readable form using display unit 32. Image analysis module 16 may generate bar graphs, charts, or any other suitable visual representations 40 of the error information. In a particular embodiment, image analysis module 16 analyzes and graphs position errors identified over the entire surface of workpiece 18. Image analysis module 16 may be implemented in hardware, software, or a combination of hardware and software.

System 10 may operate in a calibration mode or a real-time error correction mode. When in the calibration mode, system 10 profiles the positioning accuracy of a wafer handling device over a specified plane of operation, generates control information to improve the positioning accuracy of the wafer handling device, and stores the control information for future use by the wafer handling device. Workpiece 18 includes reference marks distributed over the specified plane of operation, and control module 12 automatically moves workpiece 18 according to a programmed pattern of movement so that image acquisition module 14 may capture images of the distributed reference marks on the surface of workpiece 18. In a particular embodiment, image analysis module 16 defines a test matrix of reference points on the surface of workpiece 18, and control module 12 moves workpiece 18 so that image acquisition module 14 may capture an image of each reference point in the test matrix.

Using the captured images, image analysis module 16 identifies position errors. Image analysis module 16 may identify position errors as image acquisition module 14 captures images of the reference marks on workpiece 18. Alternatively, image analysis module 16 may identify position errors after control module 12 completes its programmed pattern of movement, and image acquisition module 14 completes capturing images of the reference marks. In a particular embodiment, image analysis module 16 determines whether the wafer handling device satisfies original equipment manufacturer (OEM) specifications.

Image analysis module 16 generates control information to correct the identified position errors and stores the control information for future use by the wafer handling device. In a particular embodiment, image analysis module 16 stores the control information in a PROM or other memory device 42 that can be installed in the wafer handling device. The generated control information automatically corrects the position errors identified during this calibration process. As a result, system 10 improves the positioning accuracy of the wafer handling device. In a particular embodiment, system 10 is portable so that it may be easily transported from one site to another to calibrate different wafer handling devices.

When in the real-time error correction mode, system 10 identifies and corrects position errors as a wafer handling device operates on a wafer. In such an embodiment, workpiece 18 is the wafer on which the wafer handling device is operating. Chuck 22 receives workpiece 18, and control module 12 moves workpiece 18 to a programmed position so that the wafer handling position may operate on a specified portion of workpiece 18. Before the wafer handling device performs any operations on workpiece 18, image acquisition module 14 captures an image of at least one reference mark and communicates the captured image to image analysis module 16. As described above, the reference mark may be an integrated circuit on workpiece 18, a component part of an integrated circuit, identifiable features in the integrated circuits, bond pads, or any other visual mark on workpiece 18.

Image analysis module 16 identifies the reference mark and retrieves target information indicating the desired position of the reference mark according to the operation the wafer handling device is going to perform. By comparing the captured image and the target information, image analysis module 16 determines whether control module 12 has properly positioned workpiece 18 for the operation. If workpiece 18 is improperly positioned, image analysis module 16 communicates control information to control module 12 to correct the position error. Once system 10 properly positions workpiece 18, the wafer handling device operates on workpiece 18. By providing real-time position correction, system 10 improves the performance of the wafer handling device and reduces the need for external, time-consuming maintenance and calibrations. In a particular embodiment, system 10 identifies and corrects position errors during each movement of workpiece 18, and as a result, wafer handling device can accurately position workpiece 18 without using error correction tables.

Figure 2:
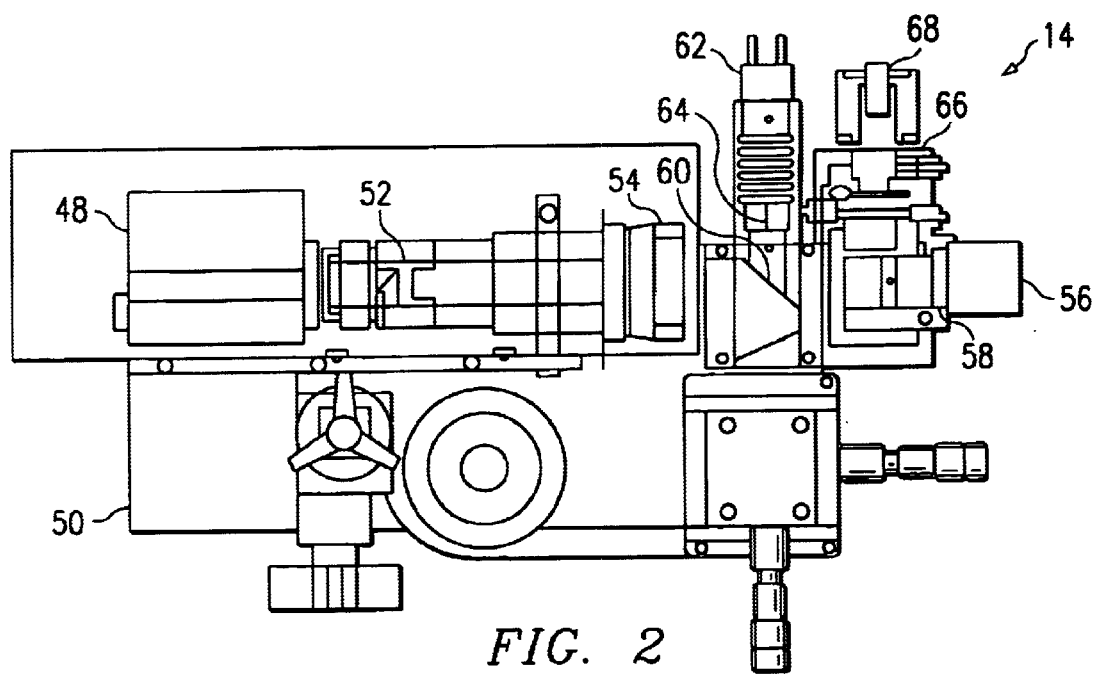
FIG. 2 illustrates an image acquisition module for capturing an image of a workpiece in a wafer handling device.

FIG. 2 illustrates a specific embodiment of image acquisition module 14. Image acquisition module 14 includes a high resolution camera 48, an optics table 50, a negative achromatic lens 52, a lens 54, a splitter cube 56, a Gaertner lens 58, a beam splitter 60, a lamp 62, a diffuser 64, an optical switch 66, and a stepper motor 68. High resolution camera 48 couples to negative achromatic lens 52, which is coupled to lens 54. In a particular embodiment, high resolution camera 48 is a charge-coupled display (CCD) camera, and lens 54 is 105 millimeters. To reduce any distortion in the image of workpiece 18, lamp 62 provide lighting for the surface of workpiece 18. Lamp 62 shines light through diffuser 64, beam splitter 60, Gaertner lens 58, and splitter 56 to the surface of workpiece 18. An image of workpiece 18 enters image acquisition module 14 through splitter cube 56, and the image passes Gaertner lens 58 and beam splitter 60 before reaching lens 54. Optical switch 66 and stepper motor 68, which are disposed between splitter cube 56 and beam splitter 60, focus the image of workpiece 18. Although FIG. 2 illustrates a particular embodiment of image acquisition module 14, a person skilled in the art could implement system 10 using a variety of alternative devices to capture images of workpiece 18.

Figures 3A, 3B:
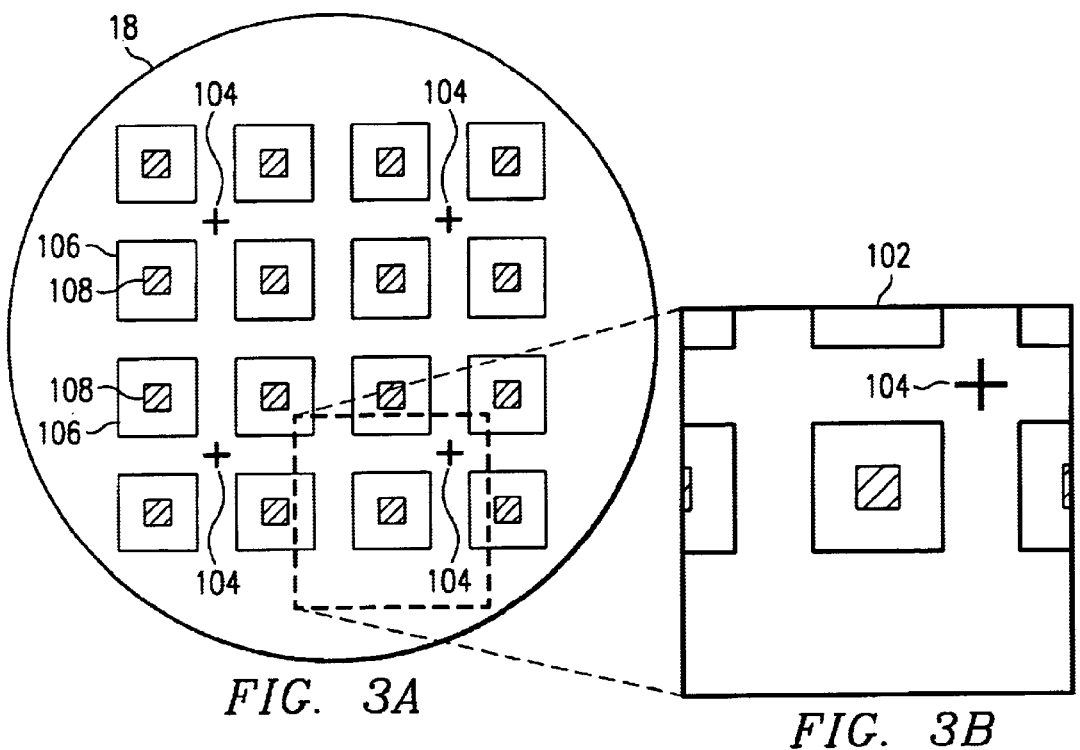
FIG. 3 illustrates a workpiece and a captured image of the workpiece.

FIG. 3 illustrates workpiece 18 and a captured image 102 of workpiece 18. Workpiece 18 includes reference marks 104. Although reference marks 104 appear as crosshairs in FIG. 3, reference marks 104 may include etchings, impressions, prints, or any other visual marks suitable to identify a position on workpiece 18. In a particular embodiment, workpiece 18 is a gauge, and reference marks 104 are located at predetermined positions relative to one another so that system 10 may use reference marks 14 to measure distances along one or more axes. In an alternative embodiment, workpiece 18 is an actual wafer of integrated circuits 106, and integrated circuits 106, component parts 108, bond pads, or other identifiable features of integrated circuits 106 serve as reference marks.

Captured image 102 includes one of reference marks 104. As described above, image acquisition module 14 communicates captured image 102 to image analysis module 16, and image analysis module 16 compares captured image 102 to stored target information to determine a position error. More specifically, image analysis module 16 identifies reference mark 104 from captured image 102, retrieves target information indicating a desired position for reference mark 104, determines whether reference mark 104 is within a threshold distance of the desired position. If reference marks 104 is not within the threshold distance, then image analysis module 16 identifies a position error.

Figures 4, 5:
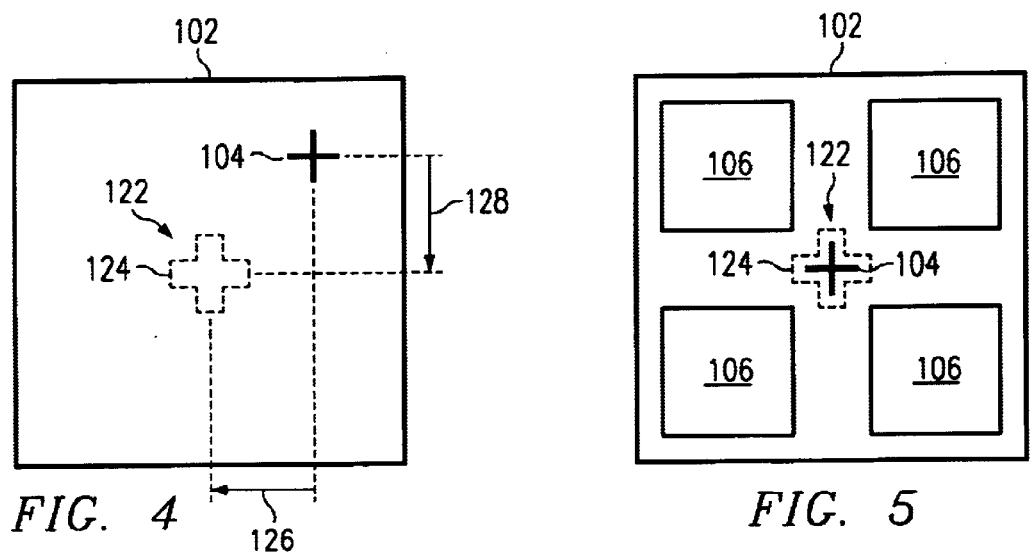
FIG. 4 illustrates a captured image of an incorrectly positioned workpiece.
FIG. 5 illustrates a captured image of a correctly positioned workpiece.

FIG. 4 illustrates captured image 102 demonstrating a position error. Straight lines represent captured image 102, and dashed lines represent target information 122. Captured image 102 includes reference mark 104, and target information 122 indicates a desired position 124 for reference mark 104. As described above, by comparing captured image 102 and target information 124, image analysis module 16 determines whether reference mark 104 is within a threshold distance of desired position 124 and identifies a position error if reference mark 104 is not within the threshold distance. In addition, image analysis module 16 may determine a direction and magnitude of an identified position error along an axis by calculating a distance between reference mark 104 and desired position 122 along the axis. An arrow 126 indicates a direction and magnitude of the position error along a x-axis, and an arrow 128 indicates a direction and magnitude of the position error along a y-axis. Based on the directions and magnitudes of the position error along the X and Y axes, image analysis module 16 generates control information to correct the position error and communicates the control information to control module 12. Specifically, image analysis module 16 instructs control module 12 to move workpiece 18 in the directions and magnitudes of arrows 126 and 128.

FIG. 5 illustrates captured image 102 demonstrating the proper positioning of workpiece 18. Reference mark 104 is within a threshold distance of desired position 124. In a particular embodiment, workpiece 18 is a wafer, and integrated circuits 106 are properly within a wafer handling device's work space.

FIG. 6 illustrates a flowchart of a method for determining a position error in a wafer handling device. The flowchart begins at step 200, where chuck 22 receives workpiece 18 including reference marks 104. Control module 12 moves workpiece 18 to a programmed position under lens 26 at step 202. Image acquisition module 14 captures image 102 of at least one reference mark 104 at step 204. Image analysis module 16 identifies reference mark 104 from captured image 102 at step 206 and retrieves target information 124 indicating desired position 124 for reference mark 104 at step 208. At step 210, image analysis module 16 determines whether reference mark 104 is Within a threshold distance of desired position 124. If reference mark 104 is within the threshold distance, then workpiece 18 is properly positioned, and the method continues at step 214. If reference mark 104 is not within the threshold distance, workpiece 18 is improperly positioned, and the method continues at step 220. At step 214, if system 10 is in a real-time correction mode, a wafer handling device operates on workpiece 18 at step 216, and the method continues at step 234.

At step 220, image analysis module 16 determines a direction and magnitude of the position error along one or more axes by calculating distances between reference mark 104 and desired position 124 along the axes. Image analysis module 16 generates control information according to the direction and magnitude of the position error at step 222. If system 10 is in a real-time error correction mode at step 224, then control module 12 moves workpiece 18 according to the control information to correct the position error at step 226, and the wafer handling device operates on workpiece 18 at step 228. If system 10 is not in a real-time error correction mode at step 224, then system 10 is in a calibration mode, and image analysis module 16 stores the control information in memory device 42 at step 232. The method continues at step 234.

At step 234, if control module 12 has not completed the programmed pattern of movement, the method returns to step 202. If control module has completed the programmed pattern of movement, the method continues at step 236. If system 10 is in calibration mode at step 236, it corrects any identified position errors using the control information stored in memory device 42, and the method ends.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method of handling a semiconductor wafer including a plurality of integrated circuits, each of said integrated circuits having one or more reference marks, comprising the steps of:

moving the wafer to a first position so that the wafer handling device may operate on a first integrated circuit of said plurality of integrated circuits;

capturing an image of a first reference mark on said first integrated circuit;

correcting a first position error according to the captured image of the first reference mark;

operating on the first integrated circuit in response to correcting the first position error;

moving the wafer to a second position so that the wafer handling device may operate on a second integrated circuit of said plurality of integrated circuits;

capturing an image of a second reference mark on said second integrated circuit;

correcting a second position error according to the captured image of the second reference mark;

operating on the second integrated circuit in response to correcting the second position error; and repeating said steps of moving, capturing, correcting, and operating for each integrated circuit in said plurality of integrated circuits.

2. The method of claim 1, wherein:

said step of capturing an image of a first reference mark on said first integrated circuit comprises capturing an image of the first integrated circuit or a component part of the first integrated circuit; and said step of capturing an image of a second reference mark on said second integrated circuit comprises capturing an image of the second integrated circuit or a component part of the second integrated circuit.

3. A system for handling a semiconductor wafer, comprising:

a control module operable to move said wafer, said wafer having a plurality of integrated circuits, each of said integrated circuits having one or more reference marks;

an image acquisition module operable to capture an image of at least one reference mark on each integrated circuit; and an image analysis module coupled to the image acquisition module, the image analysis module operable to compare the captured image of said at least one reference mark on each integrated circuit to stored target information to determine a position error.

4. The system of claim 3, wherein the image analysis module comprises:

a memory operable to store the target information indicating a desired position for the reference mark; and a processor coupled to the memory and the image acquisition module, the processor operable to receive the captured image, to identify the reference mark from the captured image, to retrieve the target information indicating a desired position for the reference mark, and to identify a position error if the reference mark is not within a threshold distance of the desired position.

5. The system of claim 4, wherein the processor is further operable to determine a magnitude of the position error along an axis by calculating a distance between the reference mark and the desired position along the axis.

6. The system of claim 3, wherein the image analysis module is further operable to generate control information according to the position error and to communicate the control information to the control module to correct the position error.

7. The system of claim 6, wherein the image analysis module communicates the control information to the control module by storing the control information in a PROM that may be installed in the wafer handling device.

8. The system of claim 3, wherein:

the image acquisition module is further operable to capture the image of the reference mark on each integrated circuit in response to the control module moving the wafer; and the image analysis module is further operable to generate control information according to the position error and to communicate the control information to the control module to correct the position error.

9. The system of claim 8, wherein the reference mark is a component part of an integrated circuit.

10. The system of claim 3, wherein said system is a prober operable to test integrated circuits while in wafer form.

11. A method of handling a semiconductor wafer including a plurality of integrated circuits, each of said integrated circuits having one or more reference marks, comprising the steps of:

successively moving said wafer to a programmed position corresponding to each of said plurality of integrated circuits;

capturing an image of said at least one reference mark on each said integrated circuit in response to moving the wafer to the programmed position corresponding to said integrated circuit; and determining a position error by comparing the captured image to stored target information.

12. The method of claim 11, wherein determining the position error further comprises:

identifying the reference mark from the captured image;

retrieving the target information indicating a desired position for the reference mark;

determining whether the reference mark is within a threshold distance of the desired position; and identifying a position error if the reference mark is not within the threshold distance.

13. The method of claim 11, further comprising determining a magnitude of the position error along one or more axes.

14. The method of claim 11, further comprising: generating control information according to the position error; and correcting said position error by moving said wafer.

15. The method of claim 14, wherein communicating the control information further comprises storing the control information in a PROM.

16. The method of claim 11, wherein the reference mark is a component part of an integrated circuit.

17. The method of claim 11, further comprising the step of probing each said integrated circuit.

\* \* \* \* \*